United States Patent [19]

Kempf

[11] Patent Number: 5,913,653
[45] Date of Patent: *Jun. 22, 1999

[54] DEVICE FOR TRANSPORTING SUBSTRATES

[75] Inventor: Stefan Kempf, Alzenau-Albstedt, Germany

[73] Assignee: Singulus Technologies GmbH, Alzenau, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/833,987

[22] Filed: Apr. 11, 1997

[30] Foreign Application Priority Data

Apr. 13, 1996 [DE] Germany .................. 196 14 596

[51] Int. Cl.$^6$ .................................................. B65G 65/02
[52] U.S. Cl. .................. 414/226; 118/500; 118/502; 118/503; 118/728; 369/270; 414/908
[58] Field of Search .................. 414/217, 222, 414/225, 226, 908; 294/88, 95, 97; 118/500, 502, 503, 728; 369/270, 271; 360/99.05; 279/2.06–2.09

[56] References Cited

U.S. PATENT DOCUMENTS

| | | | |
|---|---|---|---|
| 3,253,853 | 5/1966 | Loyer et al. | 294/88 |
| 4,199,183 | 4/1980 | Hecker | 294/97 |
| 4,676,710 | 6/1987 | Shiraishi | 414/225 |
| 4,948,187 | 8/1990 | Blaseck | 294/95 |
| 4,969,790 | 11/1990 | Petz et al. | 414/217 |
| 5,112,469 | 5/1992 | Kempf et al. | 414/217 X |
| 5,259,942 | 11/1993 | Kempf | 414/217 X |
| 5,451,130 | 9/1995 | Kempf | 414/217 X |
| 5,637,200 | 6/1997 | Tsymberov | 118/728 X |
| 5,669,652 | 9/1997 | Reising et al. | 294/97 X |
| 5,675,957 | 10/1997 | Kim | 414/225 X |
| 5,698,030 | 12/1997 | Rubenchik | 118/500 X |

FOREIGN PATENT DOCUMENTS

| | | |
|---|---|---|
| 389 820 | 10/1990 | European Pat. Off. . |
| 589 416 | 3/1994 | European Pat. Off. . |
| G 93 07 263 | 7/1993 | Germany . |
| 86/01010 | 11/1996 | WIPO . |

*Primary Examiner*—David A. Bucci
*Attorney, Agent, or Firm*—Pillsbury Madison & Sutro

[57] ABSTRACT

Apparatus for transporting substrates to and from at least one device (1) for holding substrates (2), the at least one device having a substrate support (5) disposed in a vacuum chamber (4, 4', 4"). The apparatus includes at least one displaceably disposed gripper (75), which can be displaced by a mechanical and/or electro-magnetically or magnetically operating positioning device (130) between a substrate gripping position and a substrate release position, and a centering device (157, 157', 161) for centering a substrate relative to the substrate support in conjunction with transport of the substrate by the apparatus to the substrate support.

26 Claims, 6 Drawing Sheets

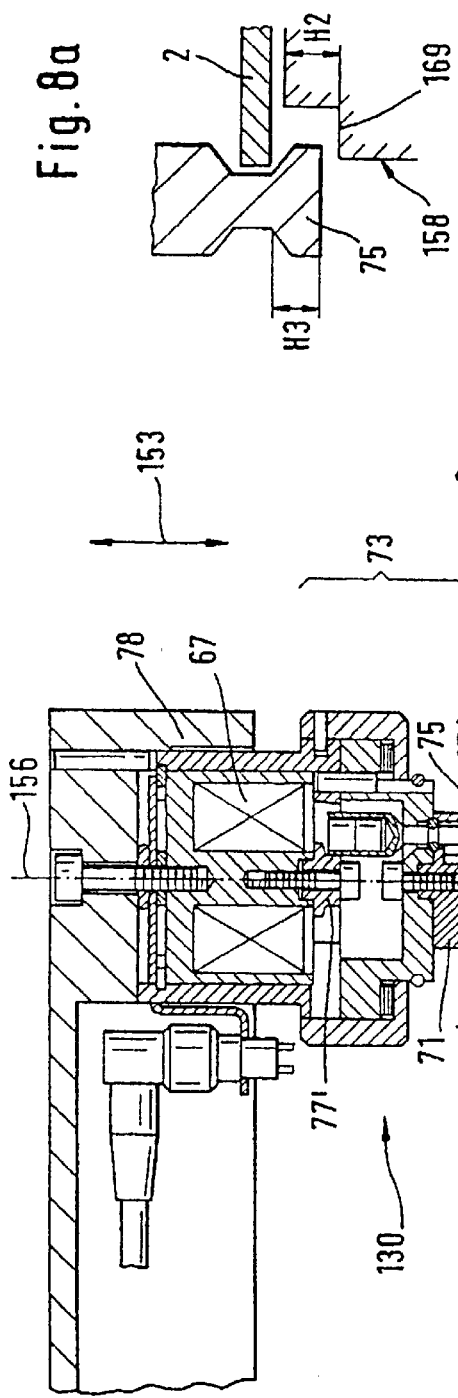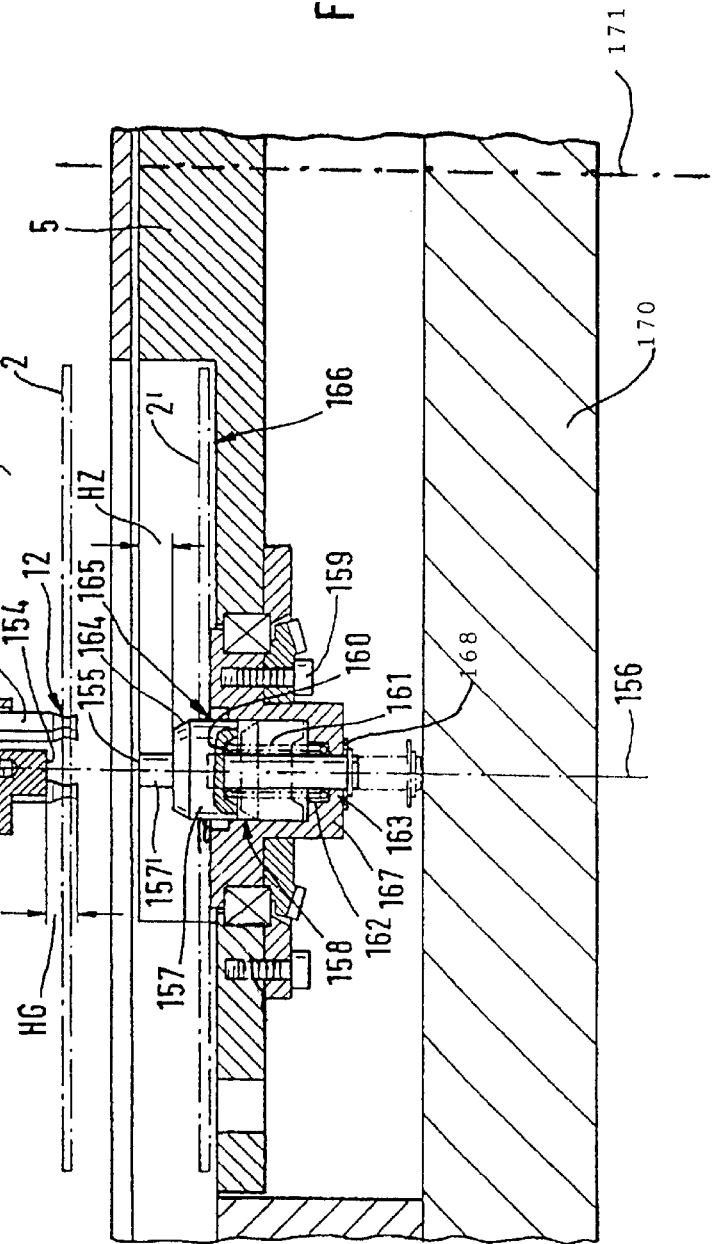

DEVICE FOR TRANSPORTING SUBSTRATES

BACKGROUND OF THE INVENTION

The invention relates to a device for transporting substrates between a first and at least one second device for gripping and holding substrates by means of one or several substrate supports disposed in a vacuum chamber.

A device for gripping and holding a disklike substrate is disclosed in German Utility Model DE-GM 93 07 263.5. This device comprises a number of circularly arranged grippers and an elastic diaphragm which is disposed in a pressure-proof housing that has an opening. Different pressures can be established on the front and back sides of the diaphragm, and the diaphragm may be arranged such that at a differential pressure, a deflection of the diaphragm out of its position of repose takes place, while at a pressure equilibrium the diaphragm returns to its position of rest.

The differential pressure at the diaphragm is generated in that a bell-shaped housing, which is provided with a central bore, is disposed on one side of the diaphragm. A pressure chamber is formed between the end of the bore of the bell-shaped housing and the surface of the diaphragm. The bore provided in the bell-shaped housing is provided via a pneumatic line with an external pump whose sole function is to establish a differential pressure on the surface of the diaphragm, relative to the vacuum pressure provided in the chamber beneath, so that by imposition of pressure on the diaphragm and by means of a positioning member, or adjusting part, adjoining the diaphragm, the gripper arm can be displaced from its position that holds the substrate into a further position in which the gripper or grippers release the substrate. Such an apparatus is complicated and expensive, since a separate pump is required to generate this differential pressure, and the diaphragm must be sealed off from the pressure in the vacuum chamber so that the requisite pressure can be generated on the back side of the diaphragm. Moreover, such an arrangement is highly vulnerable to malfunction, since the additionally required pump operates entirely uncoupled from the other pumps for generating the vacuum pressure in the vacuum chamber, so that a completely exact adaptation to the operating process for adjusting the diaphragm and removing the substrate is impossible. Overall, such an apparatus works relatively slowly, since the release of the substrate cannot occur until the necessary system pressure downstream of the diaphragm has built up via the independent pump. The compressed-air supply line must be disposed flexibly relative to the holding mechanism.

BRIEF SUMMARY OF THE INVENTION

It is an object of the present invention to provide and arrange a mechanical or electro-mechanical device, which receives substrates, in such a way that a delay-free and rapid transfer of the substrate can be performed without impairment of the surface of the substrate, and an exact alignment of the substrate on its support surface or a substrate plate is assured.

The above and other objects of the invention are achieved by an apparatus for transporting substrates to and from at least one device for holding substrates, the at least one device having a substrate support disposed in a vacuum chamber, the apparatus including at least one displaceably disposed gripper which can be displaced by means of a mechanical and/or electro-magnetically or magnetically operating positioning device between a substrate gripping position and a substrate release position, and a centering device for centering a substrate relative to the substrate support in conjunction with transport of the substrate by the apparatus to the substrate support.

The transfer of the substrate from the substrate grippers to a receiving element or a substrate plate is considerably improved in this way, because an exact coaxial alignment of the substrate in respect to the substrate plate is assured by means of the centering device, which is particularly important when the plate is intended to be rotated around its axis.

To this end, it is advantageous that the centering device, which automatically aligns the substrate in relation to a center axis of the element receiving the substrate and/or the positioning element, is associated with the element and or the positioning element.

In accordance with a further development of the device in accordance with the invention, an additional option is that the centering device is disposed to be adjustable in the direction toward the center axis, or height-adjustably, and/or coaxially with the center axis and/or coaxially with a substrate gripper disposed on a circular radius.

In accordance with preferred embodiments of the invention, it is also provided that the centering device consists of a cylinder-shaped centering pin, which can be displaced in the direction toward the gripper head against the action of a positioning means or a spring. It is assured by this that the centering device is always returned into its upper or initial position to automatically center the substrate as soon as it is placed on its support surface.

It is of particular importance for the instant invention that the grippers are arranged on the positioning device or on the gripper head and project out in respect to a surface pointing in the direction of the substrate, whose distance to the lower ends of the grippers is less than the distance between the surface of the centering pin, which points upward or toward the grippers, or of a positioning pin arranged on the centering pin, and its lower end situated outside the opening of the substrate or the bore in the substrate plate in which the centering pin is adjustably received. By means of this a collision between the substrate grippers and the centering device is prevented when a substrate exchange is to take place.

In connection with embodiments and arrangements in accordance with the invention, it is advantageous that the lower end or the portion of the centering pin projecting out of the bore of the housing has a conically tapering guide element, on which a positioning bolt is seated which can be brought to rest against a front face of the installation which is a part of the gripper head or provided on the receiving element of the gripper head. The substrate can be downwardly displaced in the direction toward the substrate plate by its own weight by means of the conical portion of the centering device.

If is furthermore advantageous that the interior diameter of the inward pivoted circularly arranged grippers is slightly greater than the exterior diameter of the centering pin, and/or that the exterior diameter of the inward pivoted circularly arranged grippers is slightly less than the interior diameter of the bore in which the centering pin is adjustably received.

It is also advantageous that the spring for displacing the centering pin is received in a bore in which the centering pin is displaceably seated.

In this connection it is advantageous that the bore has a length of such a dimension that the cylinder-shaped portion of the centering device can be pushed far enough into the bore so that the grippers can be moved into the bore of the substrate in order to lift it off the substrate plate or to place it thereupon.

It is furthermore advantageous that the first device for gripping and holding substrates is equipped with one or several displaceably arranged grippers, which can be displaced by means of a mechanically and/or electromechanically or magnetically operating positioning device into positions in which the substrate is held or released, wherein the second device for gripping and holding substrates is equipped with one or several displaceably arranged grippers which can be displaced against the effect of a positioning pressure or against the action of a spring into a first position, and by means of the effects of a diaphragm, which can be exposed to a pneumatic pressure $P_a$ and/or vacuum pressure $P_v$, and a positioning element cooperating with the latter, into a second position, wherein in the first position the substrate is held and in the second position the substrate is released to be further conveyed, and further wherein, in the position of the two devices for transferring the substrate, the two substrate receiving elements can be aligned coaxially in respect to each other and fixed in place.

Because of the advantageous combination of the electromechanical device for gripping substrates with the device for gripping the substrates which is controllable by means of vacuum pressure, a trouble-free progression of the process between the two gripper devices is assured, and at the same time it is also assured that there will be no damage to the surface of the substrates, since the grippers engage the openings of the substrates and in this way maintain the substrates in the desired position. By means of the electromechanical displacement device and the associated grippers which perform a tilting movement by means of the displacement device, a substrate can easily be grasped in the opening provided for this purpose and can be secured, to which end the appropriate grippers are displaced into a vertical position. An optimal positioning force is obtained because of the magnets, which cause the desired pivot movement of the grippers in milliseconds. Following the transfer from one gripping device to another one, the second gripper is triggered for receiving the substrate via the vacuum control, wherein here the vacuum pressure of the second vacuum chamber is employed in an advantageous manner and it is therefore possible to make do without any additional units. This second gripping device also operates very exactly, and by means of the engagement of its grippers in the bore provided in the substrate it is also assured that the surface of the substrates is not contacted in any way.

In this connection it is advantageous that, following the coaxial alignment and with the two devices in vacuum-sealed contact, the pressure in the lock chamber is lowered and the substrate which was transferred by the first device to the second device is now held by the second device by means of the now applied spring pressure, and that a spring-elastic connecting element, which permits a lifting movement, is provided between a turntable of the second device and a substrate support.

In accordance with a further development of the device in accordance with the invention, there is an additional option that the connecting element consists of a central flange which is connected via connecting elements with the substrate support, and via elastic bars with the turntable, that the grippers associated with the first device can be pivoted by means of a positioning element or a magnet and/or spring elements around an axis between a position where the substrate is held and one where the substrate is released, and that the grippers associated with the first device can be pivoted around an axis which intersects the longitudinal axis of the gripper or of the housing at approximately right angles.

It is furthermore advantageous that the grippers assigned to the first device already react when the lock chamber is flooded and the grippers of the second device are displaced into a receiving position by the electromagnet, and that two or more grippers of the first device arranged at a distance from each other in the course of the substrate transfer enter into the gap between the grippers of the second device, which are also arranged at a distance from each other. Because of the exactly controllable course of the process and the exact matching of the two cooperating gripper devices it is possible to perform an exact transfer of the substrate from the one to the other device, wherein for this purpose it is possible to make do with a minimum of components.

In further accordance with the invention, it is advantageous that in the area of their one end the grippers are guided in elongated hole openings and have at least one permanent magnet which acts together with an ring magnet in a cylinder housing in the area of their other end. By using the elongated, relatively narrowly embodied grippers for receiving the substrate it is possible to provide corresponding gaps between the individual substrate holders, so that two cooperating devices can be moved very closely next to each other in order to assure the exact transfer of the substrates between the two devices.

In accordance with a further development of the invention, there is the option that the cylinder housing is embodied with thin walls and has a wall thickness of between 0.2 mm and 0.8 mm, or preferably between 0.3 mm and 0.7 mm, or more preferably between 0.4 mm and 0.6 mm.

It is furthermore advantageous that the grippers are pivotably received in an elastic annular bearing and can be displaced between magnetizable stops in the area of their upper ends.

It is furthermore advantageous that the diaphragm, which is exposed to an approximately constant vacuum pressure $P_v$ on one side, can be controlled by means of a differential pressure $P_d = P_a - P_v$ which occurs when the chamber is flooded for receiving a substrate.

In accordance with a further development of the invention, there is the additional option that the diaphragm can be controlled by means of the atmospheric and/or vacuum pressure or the differential pressure $P_d$, which results from the atmospheric pressure $P_a$ in the lock chamber minus the vacuum pressure $P_v$ in the vacuum chamber. Because of the advantageous arrangement of the diaphragm, which projects into the vacuum chamber, it is possible for the first time to employ the vacuum pressure occurring in the chamber as a regulated quantity for displacing the diaphragm.

In a further development of the invention, it is advantageous that the diaphragm arranged in the vacuum chamber is constituted of a flexible part and an inflexible part or a metal part or plate. The exact guidance of the positioning elements for positioning or displacing the grippers is created by the use of a flexible and an inflexible part for forming the diaphragm.

In accordance with a preferred embodiment of the invention, it is also provided that the inflexible part is fixedly connected with the flexible part of the diaphragm, and that the inflexible part is designed as a circular plate covering an opening of the diaphragm.

It is furthermore advantageous that the flexible part of the diaphragm is fixedly connected by its outer rim to a flange of the device, and by its inner rim is fixedly connected with the rim of the opening provided in the plate, and that the diaphragm and the plate seal the chamber, which is exposed to a steady vacuum pressure $P_v$, against the chamber or lock chamber, which can be exposed to atmospheric pressure $P_a$.

In addition, it is advantageous that the outer rim of the diaphragm can be clamped and secured in at least one groove provided between the flange and the exterior part of the substrate holder, and that via a coaxial pin the plate is connected with or screwed to a cylinder-shaped element, which is guided on a pin connected with a flange which is also coaxially disposed. Because of the employment of a groove for receiving the outer rim of the diaphragm, a very simple type of fastening of the diaphragm is achieved, which furthermore provides tight sealing between the flooded chamber and the vacuum chamber. Since the plate is connected with or screwed to the cylinder-shaped element via a coaxial pin, it is possible to easily release the diaphragm in case of damage. To achieve this it is merely necessary to unscrew the plate and to release the clamped connection of the diaphragm. Thereafter the elements can easily be replaced.

It is furthermore advantageous that the cylinder-shaped element is fixedly connected with the positioning element and that the positioning element rests against one or several grippers in the area of one of its ends.

In accordance with a further development of the invention, it is an additional option that the cylinder-shaped element can be placed with its one or second end or with its plate against a fixed flange, and with its first or other end or positioning element against the gripper or the lever arm of the gripper, and that when the difference pressure $P_d$ occurs, the diaphragm moves further into the vacuum chamber and in the process moves the gripper(s) away from the bore rim of the substrate and releases them.

According to a further feature of the invention, it is advantageous that the fixed flange is indirectly or directly fixedly connected with the flange of the device and has a cylinder-shaped extension in which a spring is received. By using a cylinder-shaped extension on the fixed flange, satisfactory guidance of the spring is assured and it is simultaneously also assured that an immediate displacement of the grippers takes place upon a pressure equalization between the two chambers.

It is furthermore of advantage that a support element for pivotably receiving the grippers is provided between the flange of the device and the fixed flange, and that the fixed flange and the support element are releasably connected via the same connecting elements with the flange of the device. Since the support element for receiving the grippers is arranged between the two flanges, a very good, simple fixation of the holder is obtained.

An essentially advantageous embodiment is obtained in that the chamber located above the diaphragm or the lock chamber is evacuated by means of a first vacuum pump and is flooded by means of a further device, and the vacuum chamber situated under the diaphragm is evacuated by means of a second vacuum pump, wherein the two vacuum pumps or the associated valves can be controlled in such a way that the difference pressure $P_d$ can be reduced to almost zero, and that the upper chamber, which is flooded by means of a device or by means of a control valve, initiates the immediate displacement of the gripper because of this in a compulsory manner, and that the diaphragm is integrated into the vacuum chamber in such a way that in one operating position it is exposed to the atmospheric pressure $P_a$ on the one side and to the vacuum pressure $P_v$ on the other side, and in a second position is exposed to vacuum pressure $P_v$ on both sides.

Further advantages and details of the invention are described in the following specification and illustrated in the drawings.

BRIEF DESCRIPTION OF THE SEVERAL VIEWS OF THE DRAWING

FIG. 8 is a sectional view of a further exemplary embodiment of a first substrate gripper with an electro-magnetically acting positioning device as well as a positioning device for positioning a centering pin for the substrate.

FIG. 8a is a detail view of a portion of the structure shown in FIG. 8.

DETAILED DESCRIPTION OF THE INVENTION

Figure 1:
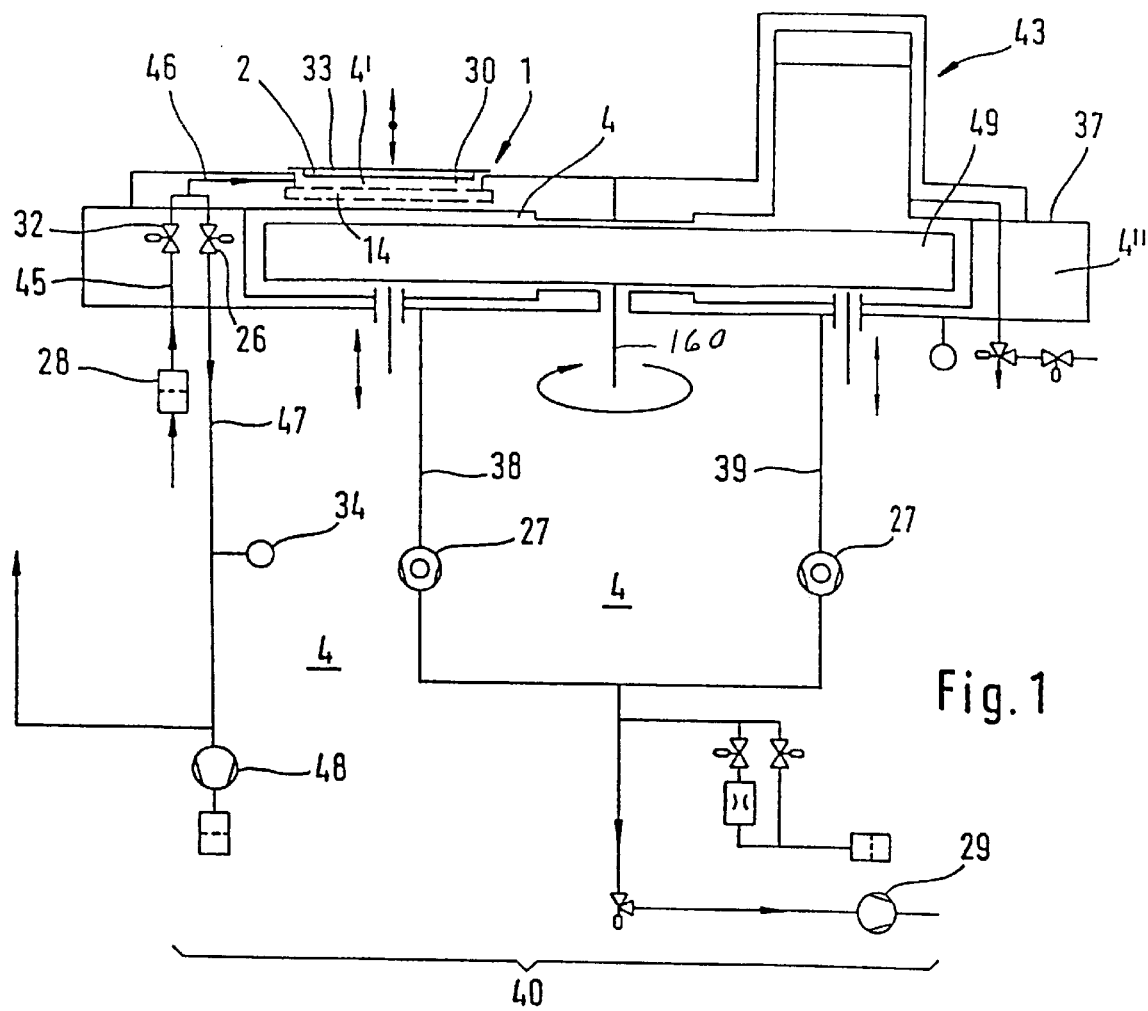
FIG. 1 is a simplified pictorial view of substrate transporting apparatus in a sputtering system.
Figure 2:
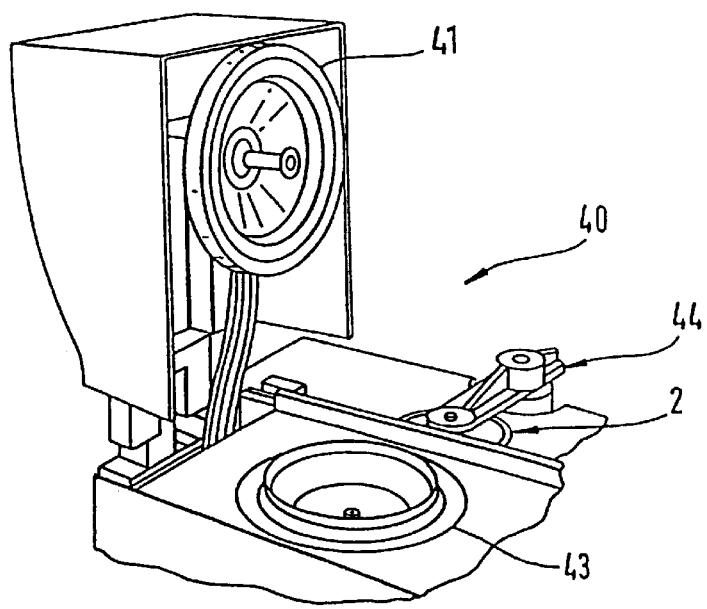
FIG. 2 is a perspective view of an apparatus for coating compact disks.

In the drawing, FIG. 2 shows a perspective view of an upper portion of a sputtering system 40, which includes a gripper arm 44, supported to be rotatable through an angle 180° about a vertical axis, by means of which substrates or compact disks (CD) 2 are delivered to a device, or disk receiver, 1 (FIG. 1) for gripping substrates. Via this device 1, the substrates reach a processing station 43, which also includes a cathode 41 shown in an open position in FIG. 2. The sputtering system shown in FIG. 2 can be constituted, for example, by a system marketed by Singulus Technologies GmbH of Alzenau, Germany, under the model designation SINGULUS III.

In FIG. 1, the functional diagram of the sputtering system 40 is shown along with the essential parts of the apparatus.

The substrate 2 is given up by means of the gripper arm 44 and an associated plate 33, which also includes a gripper device not shown in FIG. 1, to a further device for gripping substrates. In FIG. 1, the plate 33 is located above a plate or substrate receiving part 14. In the position of FIG. 1, the two plates 33 and 14 are oriented coaxially to one another, so that the substrate 2 can be given up by the plate 33 to the substrate receiving part 14.

In the position of FIG. 1, the plate 14 has moved upwardly and seals off an annular volume or infeed chamber 30. The infeed chamber 30 is located between the upper plate 33 and the lower plate, or substrate receiving part, 14. The gripper elements provided on the plate 33, which are not shown in FIG. 1, hold the compact disk above the substrate receiving part 14.

The infeed chamber 30 can be flooded via a filter 28, which for that purpose communicates via a line 45 with a valve 32 that is connected via a further line 46 to the infeed chamber 30. By opening the valve 32, the infeed chamber 30 is flooded. Once the infeed chamber 30 has been flooded, the upper plate is raised, so that the substrate 2 can be replaced. By means of the gripper arm 44, a finished coated compact disk 2 can be delivered to a further transport device, not shown. At the same time, a new compact disk 2 to be processed is placed in the infeed chamber 30. Lowering of plate 33 causes an O ring, not shown in the drawing, to be pressed against the surface of a housing 37 of the infeed chamber 30, which is thereby closed in vacuum-tight fashion. The atmospheric pressure prevailing in the infeed chamber 30 is evacuated by closure of the valve 32, followed by opening of a valve 26 which communicates with the infeed chamber 30 via the line 46. A vacuum pump 48 pumps out the air in the infeed chamber 30 and generates the requisite vacuum pressure.

In this operation, grippers 3 open, which are shown in detail in FIG. 3 and described in detail below. The grippers 3 grasp the substrate or compact disk 2. This occurs immediately when the pressure in the infeed chamber 30 is approximately equivalent to the pressure in a vacuum chamber 4 (FIG. 3), or in other words once a pressure equilibrium has been established. If the infeed chamber 3 has been evacuated enough that the requisite measuring pressure, which is ascertained by means of a measuring cell 34, is established, then the device 1 can be lowered downward, and the substrate 2 placed on the turntable 49 (FIG. 1) can be delivered in increments to the processing station 43 by means of the turntable 49. To that end, the turntable 49 rotates onward by 120° in each step. In FIG. 2, turntable 49 is located below station 43 and compact disk 2. The gripper arm 44 shown in FIG. 2 is not shown in FIG. 1.

Next, the substrate receiving part 14 is raised and an O ring, not shown, presses against the underside of the cathode 41.

After this work step, the infeed chamber 30 can again be flooded via the valve 32. In this flooding process a differential pressure $P_d$ is created, resulting from the atmospheric pressure $P_a$ in the infeed chamber 30 and the vacuum pressure $P_v$ in the vacuum chamber 4 (see FIG. 3) ($P_d=P_a-P_v$)

Because of this differential pressure, the grippers 3 are pivoted again and the substrate 2 is released. In this operation, the gripper of the substrate receiving part or of the plate 33 is activated at the same time, so that the substrate can be taken over by the plate 33. This process is repeated continually.

The vacuum chamber 4 is evacuated via the lines 38, 39 and the prepump 29.

Figure 3:
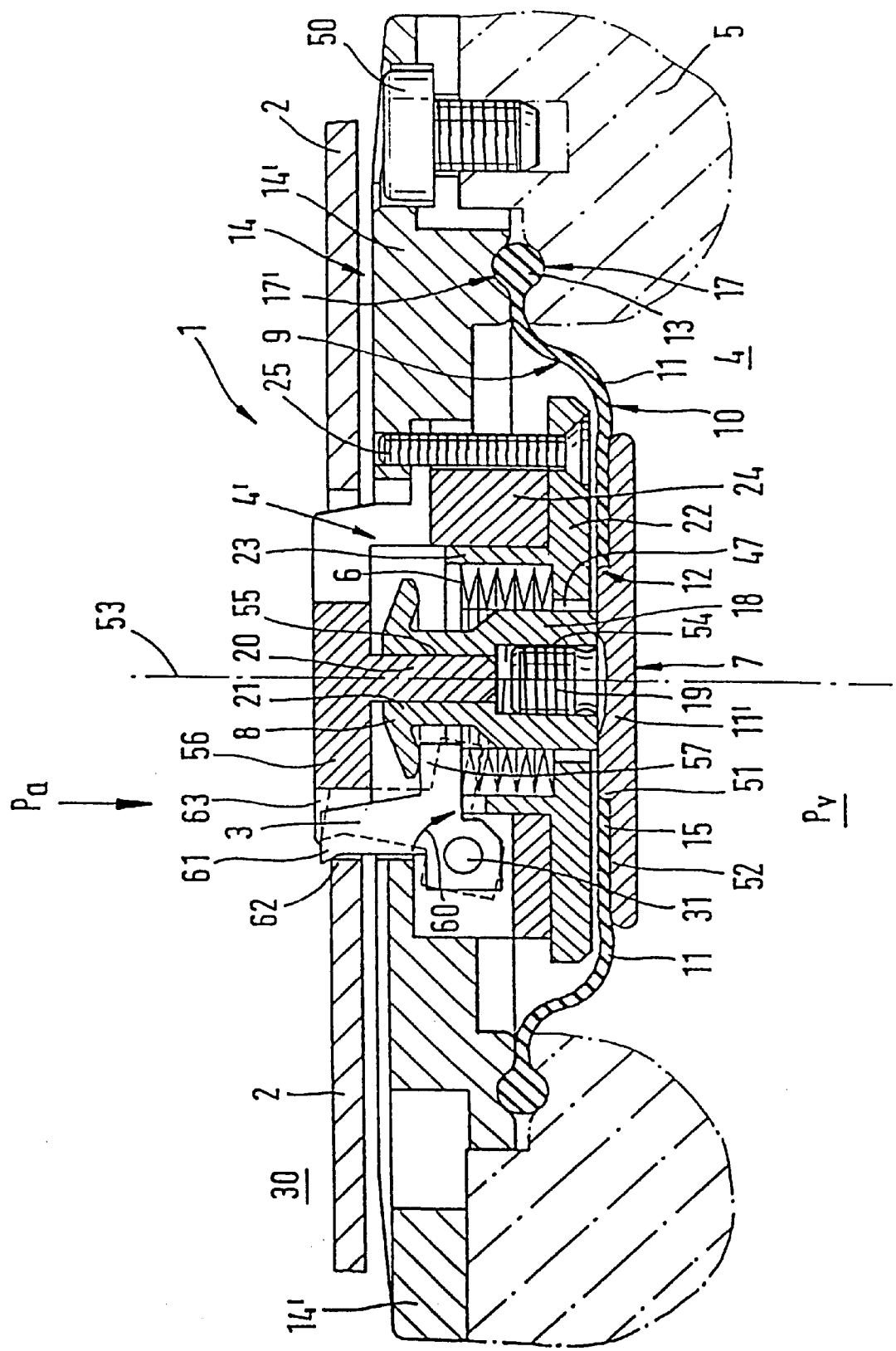
FIG. 3 is a cross-sectional elevational view a device according to the invention for gripping and holding a flat, preferably disklike, substrate.

In FIG. 3, the device 1 for gripping and holding the substrates 2 is shown in detail.

The device 1 comprises a flange 14', which is releasably joined to a substrate holder 5 via screw bolts 50. Between the flange 14' and the substrate holder 5, an annular circular groove 17, 17' is provided, in which a beadlike edge 13 of a diaphragm 7 is clamped. The diaphragm 7 is located in the vacuum chamber 4 and comprises one flexible part 11 and one nonflexible part 11', connected thereto. Nonflexible part 11' is a circular-round plate having a central cylindrical attachment portion 51 that is held in an opening 12 of the diaphragm 7. The plate 11' has a peripheral part 52 to which the flexible part 11 of the diaphragm 7 is secured or vulcanized. The diaphragm 7 seals off the upper portion of a vacuum chamber 4' (FIG. 3) or 4" (FIG. 1) from the vacuum chamber 4 that is exposed to a permanent vacuum pressure $P_v$. A vacuum is always present in chamber 4, located below diaphragm 7. A vacuum can be established in chambers 4' and 4" when cathode 41 is in its closed position and this vacuum will be released when cathode 41 is opened. The flexible part 11 of the diaphragm 7 is connected by its outer edge 13 to flange 14' and by its inner edge 13 to the cylindrical attachment 51. The outer edge 13 is clamped in groove 17, 17' of the flange 14' and substrate holder 5.

The vacuum chamber 4', 4" is exposed to an atmospheric pressure $P_a$ whenever the valve 32, as already mentioned, is opened and the infeed chamber 30 is flooded The plate 11' of the diaphragm 7 has a protrusion 19 which is oriented coaxially to a center axis 53 of the device 1. The protrusion 19 is firmly or integrally joined to the plate 11'. The protrusion 19 has male threads 54 and can therefore be joined or releasably screwed to a cylindrical part 18.

To that end, the cylindrical part 18 is likewise oriented coaxially to the flange 14', and in its upper region it has a cylindrical bore 55 into which a protrusion 20 extends. The protrusion 20 is joined to a cylindrical attachment 56, which is fixed to the flange 14' via connecting elements 25. The compact disk or substrate 2 can be slipped onto the cylindrical attachment 56 and held by means of the three or more grippers 3. The cylindrical part 18 is vertically movable with respect to the center axis 53 on the protrusion 20 if a pressure difference $P_d$ occurs.

An adjusting part, or bell-shaped flange, 8 is provided on the upper end of the cylindrical part 18. The adjusting part 8 is firmly connected to, or integral with, an upper end 21 of the cylindrical part 18.

As can be seen from FIG. 3, the flange 8 rests with its outer end against one lever arm 57 of each gripper 3. Each gripper 3 is pivotably mounted on a bolt 31 extending horizontally in terms of FIG. 3, between the position shown in solid lines (substrate holding position) and a position shown in broken lines (substrate release position).

The lower end of the cylindrical part 18 moves with its one end on plate 11' in the direction of the underside of a fixed flange 22, while with its other end, or adjusting part 8, it rests against the grippers 3 or the lever arms 57 thereof. In this operating state, the grippers 3 are oriented in the holding position shown in FIG. 3, in which the substrate 2 is held by the grippers 3. The flange 22 is firmly joined to a support part 24 and to the flange 14' via the connecting elements 25. Located on the flange 22 is a cylindrical extension 23, in which a spring, such as a cup spring, 6 is received. The spring is braced by its lower end against the flange 22 and by its upper end against the lever arms 57 of the grippers 3 and presses these lever arms, in the event of a pressure equilibrium $P_a=P_v$, into their holding position shown in FIG. 3. To that end, the cylindrical spring 6 surrounds the cylindrical part 18. The support part 24 joined to the flange 22 serves the purpose of pivotably receiving the grippers 3.1 In other words, pivot bolts 31 are held in support part 24. The flange 22 has a bore 47, through which the cylindrical part 18 extends.

The fixed flange 22 and the support part 24 are releasably connected to the flange 14' of the device 1 via the same connecting elements 25. The vacuum chamber 4', 4" provided above the diaphragm 7, or the infeed chamber 30 can be flooded via the valve 32 and evacuated via the pump 48, as already explained in conjunction with FIG. 1. The vacuum chamber 4 provided below the diaphragm 7 is not flooded when operation begins, and is evacuated or held at a certain pressure level via a vacuum pump 27 or the prepump 29.

If for the work process and for transporting the substrate 2 the infeed chamber 30 or vacuum chamber 4' is flooded via the valve 32 of FIG. 1, then an immediate pressure rise $P_a$ occurs above the diaphragm 7, so that because of the pressure differential ($P_d=P_a-P_v$) the diaphragm 7 moves farther into the vacuum chamber 4, or downward in terms of FIG. 3, and by means of the adjusting part 8, the grippers 3 are pivoted inwardly as indicated by the arrow 60 out of the position shown in solid lines into the position shown in broken lines (substrate release position). In this process, the upper portion 61 of the gripper 3 moves out of range of one edge 62 of a bore 63 of the substrate 2 and in this way releases the substrate or compact disk for transporting.

Accordingly, with the system of the invention, automatic adjustment of the gripper 3 to a release position according to FIG. 3 is always effected when the infeed chamber 30 is flooded.

If the infeed chamber 30 or vacuum chamber 4' is again evacuated via the pump 48 after the substrate transfer, then a pressure equilibrium is brought about between the infeed chamber 30 and the vacuum chamber 4; as a result, the spring 6 moves the lever arms 57 and hence also the adjusting part 8 upward, since the same pressure states now prevail both on one side 9 and another side 10 of the diaphragm 7. As a result, the gripper system operates entirely without malfunction and can respond in the shortest possible time, that is, within milliseconds.

Because of the very fast response time of the grippers 3 and the automatic adjustment on flooding of the infeed chamber 30, the stability or the work process becomes freer of malfunction, and the cycle time is further shortened. Moreover, by means of this arrangement, the device 1 for gripping the substrates can be embodied substantially more simply and can thus be produced more economically, since one can make do with fewer components overall. The previous external triggering of the diaphragm for adjusting the grippers 3 was more vulnerable to malfunction and not so functionally reliable, because of the missing individual parts, for instance if the external supply pump for generating an overpressure at the diaphragm 7 failed.

The top side of the diaphragm communicates with the vacuum chamber 4' via the bore 47.

Figure 4:
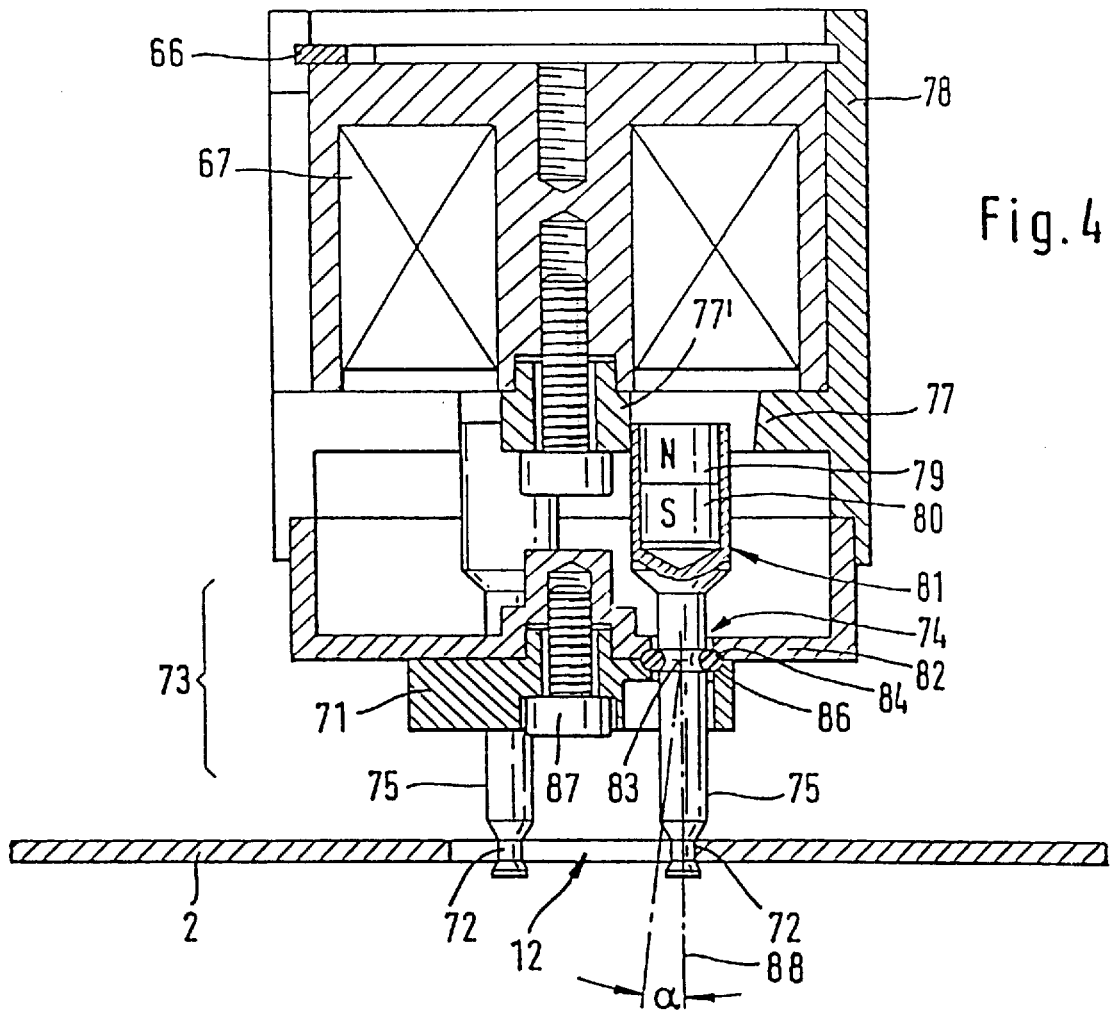
FIG. 4, a sectional view through a first substrate gripper with an electromagnetically acting adjusting device according to the invention.
Figure 6:
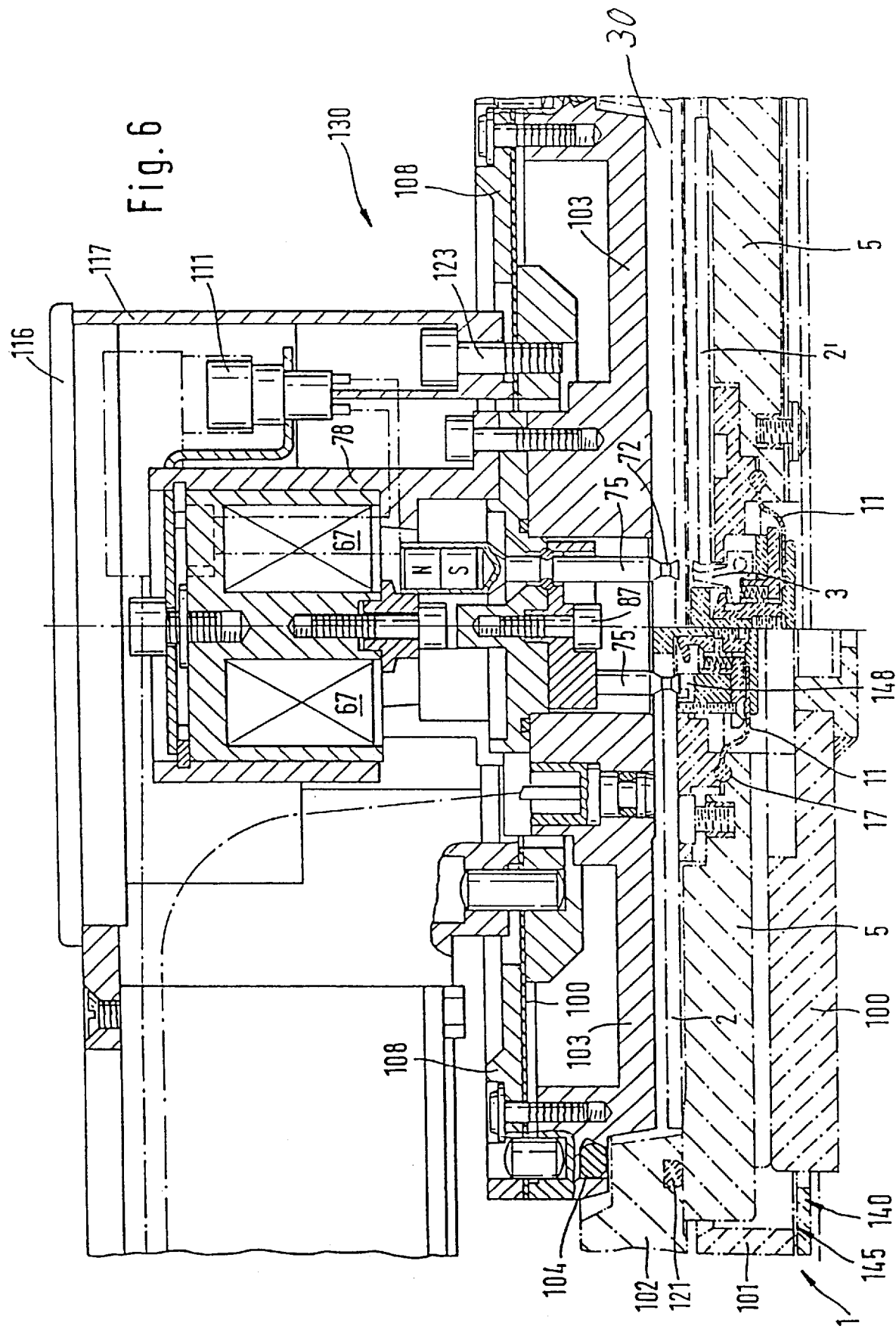
FIG. 6 is a cross-sectional elevational view apparatus according to the invention for transferring a substrate from one device having the electromagnetic adjuster to the second device having grippers controllable via a vacuum.

In FIGS. 4 and 6, a first, or upper, device 130 for gripping and holding the substrates 2 is shown. Device 130 includes grippers 75 that can each be pivoted about a respective axis 83 that extends horizontally and perpendicular to the plane of FIG. 4. To that end, the grippers 75 are disposed in a cylindrical housing 78, which serves to receive an electromagnet 67 that can be connected via a plug 111 (see FIG. 6) to a power supply device, not shown in the drawing. The electromagnet 67 is secured by means of a securing ring 66 that is provided on the upper end of the housing 78. At its lower end, the housing has a bottom 82 with at least three openings 74, through which the grippers 75 extend. Via elastically embodied bearings 84, the grippers 75 are pivotable, about the axes 83 extending horizontally with reference to FIG. 4, between two stops 77, 77' that are firmly joined to the housing 78.

As can be seen from FIG. 4, the upper end of each gripper 75 has a cylindrical housing 81 for receiving one upper magnet 79 and one lower magnet 80. The cylinder housing 81 is embodied with thin walls and has a wall thickness between 0.2 mm and 1.0 mm, preferably between 0.3 mm and 0.7 mm, more preferably between 0.4 mm and 0.6 mm, and most preferably 0.5 mm, in order to assure a good holding force at the magnet 67 upon contact.

In the exemplary embodiment, the upper magnet is marked N and the lower magnet is marked S. By supplying current to the ring magnet 67, the gripper 75 can be positioned between the two stops 77 and 77', and in the course of its movement traverses the distance represented by the angle α. In the holding position, the longitudinal center axis of each gripper 75 extends parallel to the longitudinal center axis of the housing 78. In this position, the substrate is secured via groovelike indentations 72 provided on the lower end of gripper 75.

Figure 5:
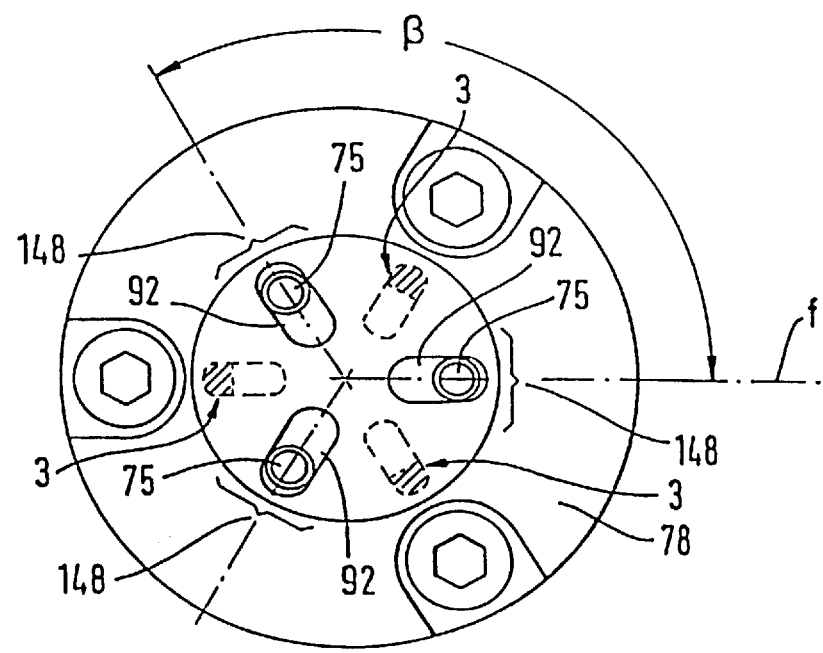
FIG. 5 is a schematic bottom plan view of the grippers of both devices according to the invention.

As seen in FIG. 5, the lower ends of the grippers extend through oblong slot openings 92, which assure an exact guidance of the grippers. If grippers 75 are pivoted by corresponding polarizations of the ring magnet 67 in terms of FIG. 4, then they moves from the left, or inner, stop 77' to the right, or outer, stop 77 and assume an inclined attitude, so that with their indentations 72 they move away from the peripheral region of the bore or opening 12 of the substrate 2 and release the substrate for transfer to the second device 1.

In the exemplary embodiment of FIG. 4, the elastically embodied bearing 84 can be received in a corresponding annular groove 86 provided in the bottom 82 and in an adjoining receiving part 71. To that end, the receiving part 72 is releasably connected to the bottom 82 of the housing 78 via screws 87.

As seen from FIG. 5, the individual grippers 75 of the first device 130 are oriented so as to be offset from one another by 120°, and in this way they are located in interstices 148 between grippers 3 of the second device 1 to grip a substrate. Because of the advantageously disposed interstices 148, the two devices 1 and 130 can be brought quite close together, and thus an exact transfer of a substrate between the two devices is assured; in such a transfer, each upper gripper 75 briefly engages at an interstice 148 between a respective pair of lower grippers 3 located side by side, once the two devices have been moved together.

As also seen in FIG. 5, the angle β between two side-by-side grippers 75 is 120°. The grippers 75, like the grippers 3, are arranged in a star pattern, and the angle between a gripper 75 and an adjacent gripper 3 is 60°.

Apparatus for gripping and holding the substrates 2 is shown more completely in FIG. 6, with the first device 130 of FIG. 4 being shown as the upper device and the second device 1 of FIGS. 1 and 3 being shown as the lower device. A substrate receiving part 73 (FIG. 4) formed by the grippers 75 and having the electromagnet 67 is, as shown in FIG. 6, received in a gripper carrier 117, which is releasably joined to a stop cap 108 via screw bolts 123. A feed cap 103 is releasably connected to the stop cap 108 by means of the screw bolts 123. The substrate receiving part 73 with the feed cap 103 forms the upper device 130 for receiving and gripping the substrates 2. If the substrate 2 is brought via the overall apparatus 130 to the second device 1 already described in detail with reference to FIG. 3, then the feed cap 103 presses sealingly via a seal 104 against the end face of a recipient cap 102 forming part of a second possible embodiment of a cathode which performs the same function as cathode 41. Between the surface of the substrate holder 5 and the underside of the feed cap 103, this forms the infeed chamber 30, which as shown in the schematic illustration of FIG. 1 can be either flooded or evacuated via the line 46 (not shown in FIG. 6).

Figure 7:
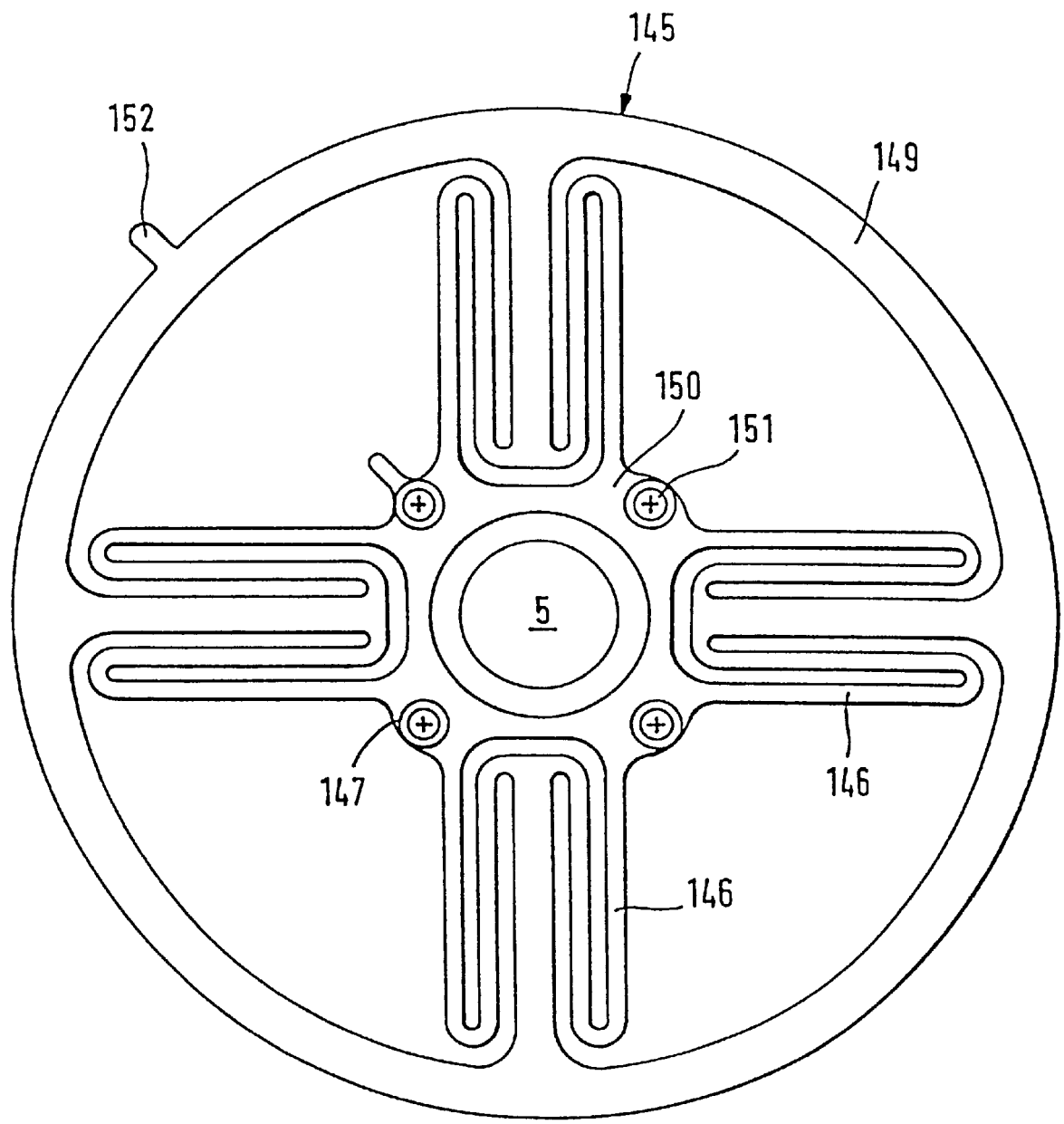
FIG. 7 is a plan view of a diaphragm-like spring between a turntable and a substrate holder in the apparatus of FIG. 6.

In FIG. 7, a spring-elastic connecting element or diaphragm part 145, also represented in FIG. 6, that allows reciprocation, is provided between a turntable 101 of FIG. 6, the second device 1 and the substrate holder 5; this connecting element or diaphragm part, formed as a circular disk, is equipped with an outer edge 149 which is joined via meandering or serpentine webs 146 to a centrally arranged flange 150. Turntable 101 corresponds to turntable 49 of FIG. 1. The flange 150 is joined to the substrate holder 5 via screw bolts 151, while the outer ring 149 is connected to the turntable 101. A protrusion 152 and a mating recess (not shown) in turntable 101 assure the correct mode of installation of the substrate holder 5 into the turntable 101 and lock the substrate holder 5 relative to the turntable 101.

By means of the diaphragm 145, these two parts are secured against relative rotation, and this assures that when the substrate holder 5 is raised the grippers 75 can engage the interstices of the grippers 3.

The transfer of the substrate 2 from the first device 130 to the second device 1 of FIG. 1 (as already described) and FIG. 6 is accomplished in the following steps:

First, the valve 26 is opened and the infeed chamber 30 is evacuated via the pump 48. This creates a pressure equilibrium on the top and bottom sides of the substrate holder 5. In this stage, the diaphragm 7 assumes the position shown in FIG. 3; the spring 6 pivots the lever or gripper 3 outward and thus holds the substrate 2 which has been delivered to it. At the same moment, the magnet 67 is triggered for this purpose and pivots the gripper 75 into an inclined position as shown in FIG. 4 (see angle α), in which the upper ends of the grippers come to rest against the corresponding stops 77 and in the process release the substrate 2.

A support plate 100 with the substrate holder 5 can now be thrust into the lower position, shown on the right in FIG. 6, and at the same time the plate or substrate holder 5 is entrained downward via the diaphragm or the connecting element 145, until the substrate holder 5 strikes a stop 140 of the turntable 101. The substrate holder 5 can now execute a pivoting motion about central pivot axis 160 of the turntable, shown in FIG. 1, without causing any relative motion between the substrate holder 5 and the turntable 101. Components 100 and 101 form elements of station 43, shown in FIG. 2.

After this work sequence, the substrate holder, identical to holder 5, of another second device 1 (not shown in the drawing) assumes the above-described position, to which end the support plate 100 with the substrate holder 1 is moved upward again, until it contacts a seal 121 and the infeed chamber 30 is closed. Plate 100 is integrated into the assembly which also includes elements 116, 117 and 130 and this assembly may be displaced by a conventional hydraulic system (not illustrated). In this adjusting operation, the substrate still remains engaged by the grippers 3 until such time as the valve 32 has opened and the infeed chamber is flooded, so that atmospheric pressure then enters the infeed chamber. This creates the aforementioned differential pressure between the top and bottom sides of the substrate holder 5, so that the diaphragm 7 moves farther into the vacuum chamber 4, and in the process pivots the grippers 3 out of the position shown in solid lines into the position shown in dashed lines in FIG. 3. As a result, the substrate or compact disk 2 is released. Now at the same moment the grippers 75 of the upper device 130 can also be triggered via the pole pieces, so that they are pivoted out of their inclined position into their vertically extending position shown in FIG. 4, in which they grasp the substrate 2. The substrate can now be lifted off, and by pivoting of the gripper carrier 117 the next substrate 2 can be put in the position described.

A further exemplary embodiment of the substrate receiving part 73 is represented in FIG. 8, which is arranged in the mechanical and/or electro-mechanical device 130 and is moved up and down by it in the direction of arrow 153 in order to be able to deposit the substrate, or CD, 2' on a placement surface 166 of the substrate plate or substrate holder 5 or to pick it up therefrom (see FIG. 8 in this connection). Substrate plate 5 is rotatably arranged in a frame, or housing, 170 so that substrate plate 5 may be rotated around an axis 171 with respect to housing 170 in order to transport substrate 2' from the position shown in FIG. 8 to an angularly displaced position where it may be picked up by another gripping tool (not shown) and transferred to, for example, a gripping and holding device as shown in FIG. 6 and described in detail in copending U.S. application Ser. No. 08/802,792, filed on Feb. 18, 1997, and entitled SUBSTRATE TRANSPORTING APPARATUS.

If the upper device 130 with the inward-pivoted grippers 75 is displaced vertically downward in the direction of arrow 153, a surface 154 disposed on the receiving part 71 and situated between the grippers 75 meets a surface 155 disposed coaxially with surface 154. The surface 155 constitutes the upper closing end of a centering pin 157, which can be displaced in the longitudinal direction along a center line 156. A control, or positioning, pin 157' is fixed to the top surface of centering pin 157. Pin 157' has an exterior diameter less than the exterior diameter of the centering pin 157, so that the grippers 75, which are arranged approximately in a circle, can grip around control pin 157' when control pin 157' comes to rest against the front face 154 of the receiving part 71. The centering pin 157 is displaceably received in a cylinder-shaped bore 158 of a housing 167, which is releasably connected via threaded bolts 159 with the substrate plate 5.

The centering pin 157 has a lower front face or depression 160, into which a spring 161 is inserted. Spring 161 rests with one end in the depression 160, and with its other end against a bottom 163 of a blind bore 162 provided in the housing 167. The spring 161 pushes the centering pin 157 in the direction of arrow 153 upward into a position receiving or centering the substrate 2 as long as the surface 154 does not rest on the surface 155. The upper and lower extremities of vertical movement of centering pin 157 are defined by a stop member (unnumbered) which includes a washer 168. Washer 168 bears against the bottom of housing 167 when centering pin 157 is in its upper end position.

In an advantageous manner, the distance HG (freestanding portion of the grippers) in accordance with FIG. 8 is less than the distance HZ (freestanding portion of control pin 157' or centering pin 157). Because of this it is possible that, in the course of lowering the upper device 130, only the front face 154 of the receiving part 71 comes to rest on the front face 155 of the positioning pin 157' and pushes it in the direction of the arrow or downwardly into a second position, shown in dashed lines. In the course of this positioning process the inwardly pivoted grippers 75 have the chance to enter into the bore or opening 12 of the substrate 2 and to reach with their depressions 72 into the inner rim area of the opening 12 of the substrate 2, because the centering pin 157 had been moved further into the bore 158. The inwardly displaced grippers 75 can now move outward, grip the substrate 2 from below and lift it off the substrate plate 5.

The upper device 130, with the grippers 75 displaced to the outside and carrying a substrate, can now be moved upward and the substrate can be transported to another processing device.

When the substrate grippers 75 have taken up a fresh substrate 2 from the next upper device 130, that upper device 130 is moved downward and the front face 154 pushes the centering pin 157 back downward until the substrate 2 can be placed on the placement surface 166 of the substrate plate 5. The substrate grippers 75 can pivot inward in their lower position and the substrate 2 can be released for placement on the substrate plate 5. Thereafter the positioning device 130 moves upward again. Simultaneously the centering pin 157 is moved upward and into the opening or bore 12 of the substrate 2 by the spring 161, so that the substrate 2 can be centered in respect to the substrate plate 5.

To this end a guide surface, or element, 164, which widens conically downwardly, extends downwardly from the lower end of the positioning pin 157' and makes a transition into a cylindrical housing, or element, 165 which comprises the depression 160 and is a part of the centering pin 157. The substrate 2 released from the grippers 75 slides over the guide element 164 onto element 165 when the spring 161 moves the centering pin 157 upwardly. The substrate 2 is automatically centered by this even if it had previously been laterally displaced in respect to the center line 156.

As can be seen in FIG. 8, the exterior diameter of the circularly arranged, inwardly pivotable grippers 75 is slightly less than the interior diameter of the bore 158 or at least an upper portion of bore 158, e.g., a widening or recess 169 (see FIG. 8a), in which the cylinder-shaped centering pin 157 has been displaceably received. The bore 158 or the exterior diameter of the centering pin 157 is approximately as large as the interior diameter of the substrate 2, so that for transferring the substrate to the substrate plate 5 the substrate grippers 75 can be moved into the bore 12 of the substrate 2 and also partially into the bore 158 of the housing 167.

As can be seen in FIG. 8a, the bore 158 has the circular widening or recess 169, into which the lower end of the grippers 75 can be inserted for gripping the substrate 2 from below. To this end, it is advantageous if the depth $H_2$ of the recess 169 is greater than the axial length $H_3$ between the depression 72 and the lower end of each gripper 75, so that the substrate 2 can be easily gripped by the depressions 72 of the grippers 75.

It will be noted that in the embodiment shown in FIG. 8, a substrate 2 is held in place on surface 166 solely by gravity, while being centered by centering pin 157. The holding device including plate 5 shown in FIG. 8 may or may not be associated with a vacuum chamber and its interior may be in communication with ambient air. This holding device is used, for example, to transport a substrate, by rotation of plate 5 about axis 171, between the location shown in FIG. 8 and an angularly offset location where the substrate may undergo a further treatment, as by irradiation with UV light, after which plate 5 may be rotated back to the position shown in FIG. 8. Alternatively, plate 5 can be displaced along a linear path. After being returned to the position shown in FIG. 8, the substrate may then be picked up by device 130 for transport to another location.

This application relates to subject matter disclosed in German application number 196 14 596.1, filed on Apr. 13, 1996, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. Apparatus for transporting substrates to and from at least one device (1) for holding substrates (2), the at least one device having a substrate support (5), said apparatus comprising at least one displaceably disposed gripper (75), which can be displaced by means of a mechanical and/or electro-magnetically or magnetically operating positioning device (130) between a substrate gripping position and a substrate release position, and a centering device (157, 157', 161) for centering a substrate relative to the substrate support in conjunction with transport of the substrate to the substrate support, wherein:

said centering device comprises a cylindrical centering pin (157) and a positioning member (161) for displacing said centering pin toward the positioning device;

said centering pin has a first diameter;

the positioning device has a first surface (154) which points in the direction toward the substrate support;

said at least one gripper comprises a plurality of grippers disposed on the positioning device and projecting beyond the first surface by a distance HG;

said centering device further comprises a control pin which projects from said centering pin by a distance HZ which is greater than the distance HG; and said control pin has a second diameter less than the first diameter.

2. The apparatus in accordance with claim 1, wherein said centering device automatically aligns the substrate in respect to a center axis of, and is associated with, one of the substrate support and the positioning device.

3. The apparatus in accordance with claim 2, wherein said at least one gripper comprises a plurality of grippers arranged on a circle and said centering device is disposed displaceably in the direction of the center axis.

4. The apparatus in accordance with claim 1, wherein said centering device is disposed on the substrate support and concentrically with respect to the center axis.

5. The apparatus in accordance with claim 1, wherein: the substrate support has a bore in which said centering pin is mounted; an upper portion of said centering pin extends out of said bore when said centering pin is displaced by said positioning member; and said upper portion of said centering pin has a conically tapering guide element (164) and a control member (157') which can be brought to rest on a surface of the positioning device.

6. The apparatus in accordance with claim 5, wherein said positioning member is a spring which is received in the bore in the substrate support.

7. The apparatus in accordance with claim 5, wherein: said at least one gripper comprises a plurality of grippers which are arranged on a circle having a center and which are movable between the substrate gripping position and the substrate release position along radial paths relative to the center of the circle; said grippers have lower ends; and when said grippers are in the substrate release position, said lower ends are disposed in an annular region having an internal diameter and an exterior diameter; and the interior diameter and exterior diameter have values such that the interior diameter is slightly larger than the diameter of said centering pin, or the exterior diameter is slightly smaller than the diameter of said bore in the substrate support.

8. The apparatus in accordance with claim 5, wherein said bore is of such a length that said centering pin can be pushed into said bore by an amount sufficient to allow said gripper to be moved into said bore in order to lift a substrate off, or place the substrate on the substrate support.

9. The apparatus in accordance with claim 1, wherein the substrate support defines a lock chamber in which a substrate is held, said lock chamber is sealable by the at least one device and said positioning device, and the pressure in said lock chamber is reducible to allow a substrate which has been transferred to the at least one device by said positioning device to be held on the substrate support.

10. The apparatus in accordance with claim 9, wherein the gripper is displaced into a receiving position by means of an electromagnet when the lock chamber is flooded.

11. The apparatus of claim 1, wherein said device (1) for holding substrates (2) further comprises a turntable (101), and a spring-elastic connecting element (145) held between said turntable and the substrate support to allow a reciprocating movement of the substrate support relative to said turntable.

12. The apparatus in accordance with claim 11, wherein the spring-elastic connecting element comprises a central flange which is connected via connecting elements (147) with the substrate support and via elastic bars (146) with the turntable.

13. The apparatus in accordance with claim 1, wherein the gripper is displaceable by being pivoted around an axis between the substrate gripping position and the substrate release position.

14. The apparatus in accordance with claim 1, wherein the gripper has a longitudinal axis and the axis about which the gripper pivots is substantially perpendicular to the longitudinal axis.

15. The apparatus in accordance with claim 1, wherein said gripper has one end which is guided in an elongated opening and a second end provided with a permanent magnet (80) which cooperates with a ring magnet (67) in a cylinder housing.

16. The apparatus in accordance with claim 15, wherein the cylinder housing has thin walls with a wall thickness between 0.2 mm and 1.0 mm.

17. The apparatus in accordance with claim 1, wherein the gripper has an upper end which is pivotably received in an elastic annular bearing (84) and which can be displaced between magnetizable stops (77, 77').

18. The apparatus in accordance with claim 1, wherein the substrate support defines a lock chamber in which a substrate is held, and the at least one device comprises a movable diaphragm (7) interposed between the lock chamber and the vacuum chamber, said diaphragm having one side which is subjected to an approximately constant vacuum pressure $P_v$ in the vacuum chamber and said diaphragm being movable under control of a differential pressure $P_d = P_a - P_v$ which occurs when the lock chamber is flooded for receiving a substrate.

19. The apparatus in accordance with claim 1, wherein the substrate support defines a lock chamber in which a substrate is held, and the at least one device comprises a movable diaphragm (7) interposed between the lock chamber and the vacuum chamber, said diaphragm being controllable by the pressure in at least one of the lock chamber and the vacuum chamber.

20. The apparatus in accordance with claim 19, wherein said diaphragm has one flexible part (11) and one nonflexible part (11').

21. The apparatus in accordance with claim 20, wherein the nonflexible part (11') is firmly joined to the flexible part (11) of said diaphragm.

22. The apparatus in accordance with claim 21, wherein the nonflexible part is a circular plate, which covers an opening (12) of said diaphragm.

23. The apparatus in accordance with claim 22, wherein the at least one device further comprises a flange, said flexible part of said diaphragm has an outer edge (13) which is firmly connected to said flange and an inner edge (15) which delimits said opening and is firmly connected to said plate.

24. The apparatus in accordance with claim 23, wherein said diaphragm seals the vacuum chamber from the lock chamber.

25. The apparatus in accordance with claim 24, wherein the outer edge of said diaphragm can be clamped and secured in at least one groove (17, 17') provided between said flange and an outer part of the substrate support.

26. The apparatus in accordance with claim 19, wherein said diaphragm is interposed between the two chamber regions so that a given pneumatic fluid pressure differential between opposite sides of said diaphragm produces movement of said gripper displacement element in a direction to move said second gripper to the substrate release position; and said apparatus further comprises: a first vacuum pump connected for evacuating the lock chamber, fluid supply means connected for supplying pneumatic fluid to the lock chamber, and a second vacuum pump connected for evacuating the vacuum chamber, said first and second vacuum pumps and said fluid supply means being controllable to selectively substantially equalize the pressures in the lock chamber and the vacuum chamber.

* * * * *